United States Patent
Okabe et al.

(10) Patent No.: US 8,893,753 B2
(45) Date of Patent: Nov. 25, 2014

(54) SUBSTRATE STORAGE POD AND LID MEMBER THEREOF, AND PROCESSING APPARATUS FOR A SUBSTRATE

(75) Inventors: Tsutomu Okabe, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 381 days.

(21) Appl. No.: 13/035,425

(22) Filed: Feb. 25, 2011

(65) Prior Publication Data

US 2011/0210042 A1 Sep. 1, 2011

(30) Foreign Application Priority Data

Feb. 26, 2010 (JP) ................................. 2010-041768

(51) Int. Cl.
*B65B 1/04* (2006.01)
*H01L 21/673* (2006.01)
(52) U.S. Cl.
CPC .... *H01L 21/67393* (2013.01); *H01L 21/67376* (2013.01); *Y10S 414/135* (2013.01)
USPC ............... 141/286; 141/63; 141/98; 206/710; 414/935

(58) Field of Classification Search
USPC ........ 141/63, 66, 286, 85, 301–302; 414/935, 414/937, 217; 206/710, 711
See application file for complete search history.

(56) References Cited

U.S. PATENT DOCUMENTS 5,575,853 A * 11/1996 Arami et al. .................. 118/708
5,810,062 A * 9/1998 Bonora et al. ................ 141/351
6,044,874 A * 4/2000 Saga ............................... 141/63
(Continued)

FOREIGN PATENT DOCUMENTS

JP 2001-15583 1/2001
JP 2003-17553 1/2003
(Continued)

OTHER PUBLICATIONS

Formal English translation of JP2007-273697, Schreiber Translations, Inc., Mar. 2013.*

(Continued)

*Primary Examiner* — Timothy L Maust
*Assistant Examiner* — Timothy P Kelly
(74) *Attorney, Agent, or Firm* — Oblon, Spivak, McClelland, Maier & Neustadt, L.L.P.

(57) ABSTRACT

The substrate storage pod includes a pod case for housing a substrate, and an opening, a lid member which closes and seals the opening, a buffer space which is defined in the lid member, an air-supply port for supplying a replacement gas into the buffer space; and multiple holes which are arranged so as to establish communication between the buffer space and an inner plate of the lid member in a state of being fit-inserted to the opening of the pod case, for sending out the replacement gas into the hollow inner space, the replacement gas having been supplied into the buffer space, the inner plate facing the hollow inner space of the pod case. With this, pressure variation of the replacement gas in supply pipes is blocked, and hence replacement-gas flow in a stable laminar state free from disturbance can be obtained.

12 Claims, 8 Drawing Sheets

(56) References Cited

U.S. PATENT DOCUMENTS

| | | | |
|---|---|---|---|
| 6,221,163 B1* | 4/2001 | Roberson, Jr. et al. | 118/715 |
| 6,390,145 B1 | 5/2002 | Okabe et al. | |
| 6,641,349 B1 | 11/2003 | Miyajima et al. | |
| 6,808,352 B2 | 10/2004 | Seita | |
| 6,899,145 B2* | 5/2005 | Aggarwal | 141/11 |
| 7,658,289 B2* | 2/2010 | Sumi et al. | 206/710 |
| 8,043,659 B2* | 10/2011 | Takahashi et al. | 427/248.1 |
| 8,522,836 B2* | 9/2013 | Okabe et al. | 141/286 |
| 2005/0098106 A1* | 5/2005 | Fink et al. | 118/715 |
| 2009/0092468 A1 | 4/2009 | Oyama et al. | |
| 2010/0059408 A1 | 3/2010 | Igarashi et al. | |
| 2010/0117377 A1 | 5/2010 | Okabe et al. | |
| 2010/0133270 A1 | 6/2010 | Okabe et al. | |
| 2011/0210041 A1* | 9/2011 | Okabe et al. | 206/710 |

FOREIGN PATENT DOCUMENTS

| | | |
|---|---|---|
| JP | 2003-60007 | 2/2003 |
| JP | 2003-170969 | 6/2003 |
| JP | 2003-229476 | 8/2003 |
| JP | 2007-273697 | 10/2007 |
| JP | 2009-88437 | 4/2009 |

OTHER PUBLICATIONS

Japanese Office Action issued Jan. 25, 2012, in Patent Application No. 2010-041768 (with English-language translation).

U.S. Appl. No. 13/035,335, filed Feb. 25, 2011, Okabe, et al.

U.S. Appl. No. 13/041,786, filed Mar. 7, 2011, Igarashi, et al.

* cited by examiner

SUBSTRATE STORAGE POD AND LID MEMBER THEREOF, AND PROCESSING APPARATUS FOR A SUBSTRATE

BACKGROUND OF THE INVENTION

1. Field of the Invention

The present invention relates to a substrate storage pod in which substrates such as semiconductor wafers are stored in a hollow inner space to be conveyed, and more particularly, to a front opening unified pod (FOUP) which performs opening and closing of a lid on a front side, and has a replacement function with respect to a clean gas in the hollow inner space. The present invention also relates to a processing apparatus for substrates such as semiconductor wafers, the processing apparatus meeting a front-opening interface mechanical standard (FIMS) for the FOUP.

2. Description of the Related Art

Processing operation on substrates such as semiconductor wafers (hereinafter, referred to as "substrates") includes multiple processing steps. Those processing steps are performed in a clean room which has a certain size and secured cleanliness. In the clean room, there are arranged processing apparatuses for performing respective processing steps. An interior space of each of the processing apparatuses has cleanliness maintained to be higher than that in the clean room in which the processing apparatuses themselves are arranged. The substrates undergo processing in the interior space of each of the processing apparatuses. When being moved from apparatus to apparatus, the substrates are conveyed while being housed in a FOUP housing pod (hereinafter, referred to as "pod"). High cleanliness and an oxidization-resistant environment are maintained in the pod, and hence it is unnecessary to control the environment of the entire of the wide clean room. As a result, control and management can be efficiently performed; specifically, only ambient atmosphere around the substrates (minute volume relative to a volume of the clean room) has to be maintained in the high-cleanliness and oxidization-resistant states.

Figure 4:
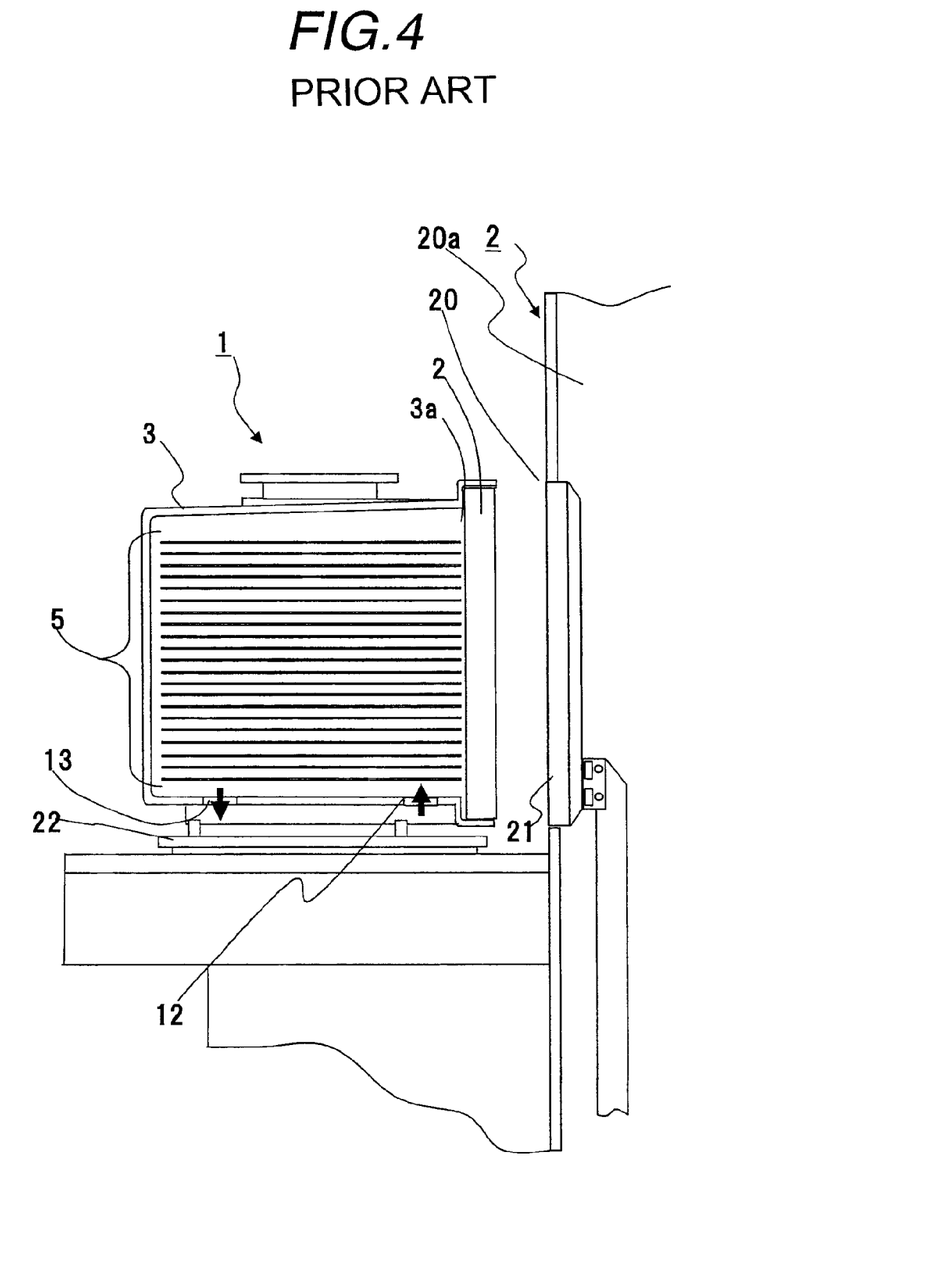
FIG. 4 illustrates a conventional pod placed on a processing apparatus.

FIG. 4 illustrates a conventional pod 1 in a state of being placed on a processing apparatus 20. Generally, the pod 1 includes a lid member 2 and a pod case 3. The pod case 3 has an opening 3a formed at one end thereof. The lid member 2 is capable of sealing the pod case 3 by closing the opening 3a. The pod case 3 includes a shelf 5 arranged therein. The shelf 5 includes multiple stages arranged in pairs in parallel with each other in a vertical direction. Each pair of the multiple stages is generally arranged horizontally, and is capable of holding corresponding one of substrates.

An interior space 20a of the processing apparatus 20 is used in processing steps performed on the substrates. The interior space 20a of the processing apparatus 20 has cleanliness maintained to be higher than ambient atmosphere in a clean room. In the interior space 20a of the processing apparatus 20, there are arranged a transfer robot, a processing device, and the like. The processing apparatus 20 has a wall portion provided with an access opening 20b for access from an outside of the processing apparatus 20 into the interior space 20a of the processing apparatus 20. When the access from the outside of the processing apparatus 20 into the interior space 20a is not performed, as illustrated in FIG. 4, the access opening 20b is closed by a FIMS door 21 (hereinafter, referred to as "door"). The processing apparatus 20 includes a load port portion 22 for placing the pod 1 thereon. The load port portion 22 functions to place the pod 1 so that the pod 1 faces the access opening 20b. That is, first, when processing steps are performed on the substrates, the pod 1 is placed on the load port portion 22 of the processing apparatus 20. On the load port portion 22 of the processing apparatus 20, the pod 1 is properly placed so that the opening 3a of the pod case 3 of the pod 1 faces the access opening 20b of the processing apparatus 20. After that, the load port portion 22 performs predetermined positioning operation on the pod 1. Simultaneously with opening and closing of the access opening 20b of the processing apparatus 20, the opening 3a of the pod case 3 of the pod 1 is opened. For example, generally, the door 21 holds the lid member 2 of the pod 1 so as to simultaneously open the access opening 20b of the processing apparatus 20 and the opening 3a of the pod case 3 of the pod 1. In this state, the substrates respectively placed on the pairs of the stages are moved in a horizontal direction so as to be taken out from the inside of the pod 1 through the opening 3a. Then, the substrates are transferred into the interior space 20a of the processing apparatus 20, and undergo the processing steps. Further, after completion of the processing steps, the substrates are transferred from the interior space 20a of the processing apparatus 20 into the pod 1 through the opening 3a. In this manner, the substrates are returned to predetermined pairs of stages of the shelf 5 in the pod case 3 in the pod 1.

When all the processing steps on the substrates in the pod 1 are completed, the door 21 of the processing apparatus 20 re-closes the access opening 20b of the processing apparatus 20. With this, the opening 3a of the pod case 3 is sealed by being closed by the lid member 2 of the pod 1, the lid member 2 being held by the door 21. In this stage, atmosphere in the pod case 3 is ambient atmosphere in the interior space 20a, the ambient atmosphere containing dust and oxygen. In order to maintain the substrates to be clean until the subsequent steps, it is necessary to remove the dust in the atmosphere so that gas components liable to react with surfaces of the substrates are removed. Therefore, generally, after the lid member 2 closes and seals the pod case 3, the atmosphere in the pod 1 is replaced with an inert gas (hereinafter, referred to as "replacement gas").

Conventional examples of means for replacing the atmosphere in the pod 1 with an inert gas include various ones. For example, Japanese Patent Application Laid-Open No. 2003-17553 and Japanese Patent Application Laid-Open No. 2003-60007 each discloses a pod of such a type that the air is supplied and exhausted through a bottom surface. In the pods of this type, as illustrated in FIG. 4, an air-supply port 12 and an exhaust port 13 are arranged in a lower portion of the pod case 3 of the pod 1. When predetermined pipes arranged on a processing-apparatus-20-side are connected to the air-supply port 12 and the exhaust port 13, as indicated by arrows of FIG. 4, the replacement gas is supplied into the pod 1 through the air-supply port 12 and exhausted from the pod 1 through the exhaust port 13.

Further, Japanese Patent Application Laid-Open No. 2007-273697 discloses an example in which an air-supply port and an exhaust port are arranged in a lid member of a pod. Japanese Patent Application Laid-Open No. 2007-273697 discloses replacement-gas flow; specifically, the replacement gas having been sent from the air-supply port of the lid member into the pod is brought into circulation in the pod and is exhausted from the exhaust port of the lid member to the outside of the pod. Specifically, in the pod disclosed in Japanese Patent Application Laid-Open No. 2007-273697, a gas-introducing pipe including squirt holes and extending in a vertical direction is attached to the lid member so that the replacement gas is introduced from the gas-introducing pipe into the pod.

In an arbitrary processing apparatus, when the lid member 2 closes the pod case 3 after completion of processing steps on substrates, the atmosphere in the pod case 3 is ambient atmosphere in a clean room, the ambient atmosphere containing dust. Thus, in the pod 1, it is necessary to replace the atmosphere in the pod 1 with the replacement gas so that the dust is not blown up and is prevented from adhering to the substrates. Thus, when the atmosphere in the pod 1 is replaced with the replacement gas, the replacement-gas flow in the pod 1 is required to enter a stable laminar state free from flow disturbance. Further, in order to completely replace the gas in the pod 1, it is necessary to achieve the replacement gas flow reaching throughout the pod 1 without stagnating therein. However, the pods disclosed in Japanese Patent Application Laid-Open No. 2003-17553, Japanese Patent Application Laid-Open No. 2003-60007, and Japanese Patent Application Laid-Open No. 2007-273697 are incapable of meeting the requirement for the following reasons.

As described in Japanese Patent Application Laid-Open No. 2003-17553 and Japanese Patent Application Laid-Open No. 2003-60007, when the air-supply port and the exhaust port are arranged in the lower portion of the pod 1, owing to limitation on sizes of the air-supply port and the exhaust port, an air-supply pipeline and an exhaust pipeline arranged therein are limited to narrow ones. Thus, it is difficult to arrange an air-supply port and an exhaust port which are suitable for requirement of the gas flow to be achieved. Specifically, after the pod 1 is placed on the load port portion 22, in many cases, a mechanism for moving the pod 1 to an appropriate position, a mechanism for locking the lid member 2 to the pod case 3, and the like are arranged in the lower portion of the pod 1 and the load port portion 22 which the lower portion of the pod 1 faces. Thus, limitation is imposed on arrangement of sizes of an air-supply port and an exhaust port of other mechanisms, and hence there is a problem in that the air-supply pipeline and the exhaust pipeline arranged therein are limited to narrow ones.

Further, as described in Japanese Patent Application Laid-Open No. 2003-17553 and Japanese Patent Application Laid-Open No. 2007-273697, even when the air-supply port and the exhaust port are arranged in a lid of the pod, owing to limitation on sizes of the air-supply port and the exhaust port, the problem still arises in that the air-supply pipeline and the exhaust pipeline arranged therein are limited to narrow ones. Specifically, it is difficult to arrange a valve member to a position optimal for functions of the valve member. This is because the lid member 2 is provided with a locking mechanism for opening and closing the lid in many cases, and hence, similarly to a case where the valve member is arranged in the lower portion of the pod, limitation is imposed on arrangement of the locking mechanism for opening and closing the lid. Thus, limitation is imposed also on sizes of the air-supply port and the exhaust port which can be arranged therein. As a result, even when the air-supply port and the exhaust port are arranged in the lid of the pod, as in Japanese Patent Application Laid-Open No. 2007-273697, the air-supply pipeline and the exhaust pipeline arranged therein are limited to narrow ones. As illustrated in Japanese Patent Application Laid-Open No. 2007-273697, when the elongated gas-introducing pipe including squirt holes and extending in a vertical direction is attached to the lid member so that the replacement gas is introduced from the gas-introducing pipe into the pod, flow-path resistance in a flow direction of the replacement gas in the gas-introducing pipe causes pressure gradient. As a result, uniform flow of the replacement gas cannot be achieved, and there is a risk that pressure variation in the gas-introducing pipe is directly transmitted into the pod.

That is, regarding air-supply and exhaust of the replacement gas with respect to the pod 1, when the air-supply port and the exhaust port provided with the air-supply pipeline and the exhaust pipeline are arranged, the pressure variation (pulse) of the replacement gas in the supply pipes has a direct influence on flow-rate variation of the replacement gas through the air-supply port and the exhaust port, the air-supply pipeline and the exhaust pipeline connected to the air-supply port and the exhaust port being limited to narrow ones. In order to obtain the replacement-gas flow in the stable laminar state free from disturbance, it is necessary to block the pressure variation (pulse) of the replacement gas in the supply pipes. Further, in order not to cause the pressure gradient at the supply ports of the replacement gas, it is necessary to arrange the squirt holes of the replacement gas.

SUMMARY OF THE INVENTION

A purpose of the present invention is to obtain the replacement-gas flow in the stable laminar state free from disturbance by suppressing the flow-rate variation of the replacement gas.

Another purpose of the invention is to reliably prevent dust adhesion to and oxidization of the substrates by exposing the entire region of substrates housed in the housing pod uniformly to the replacement gas.

A further purpose of the present invention is to provide a substrate storage pod which includes a pod case including a hollow inner space for housing a substrate, and an opening, and a lid member fit-inserted to the opening so as to be capable of sealing the opening. The lid member has a buffer space defined therein and includes multiple holes for sending out the replacement gas into the hollow inner space of the pod case, the replacement gas having been supplied into the buffer space.

A still further purpose of the present invention is to provide a processing apparatus for a substrate housed in the substrate storage pod, the processing apparatus including an interior space in which processing is performed on the substrate, an access opening which establishes communication between the interior space and an exterior space, a door which holds the lid member so as to simultaneously open the access opening and the opening of the pod case, or to simultaneously close the access opening and the opening of the pod case by fit-inserting the lid member to the opening of the pod case, and air-supply piping which is connected to an air-supply port so as to be capable of supplying the replacement gas into the buffer space.

A still further purpose of the present invention will be apparent by the following detailed description with reference to the accompanying drawings.

DESCRIPTION OF THE EMBODIMENTS

Figure 1:
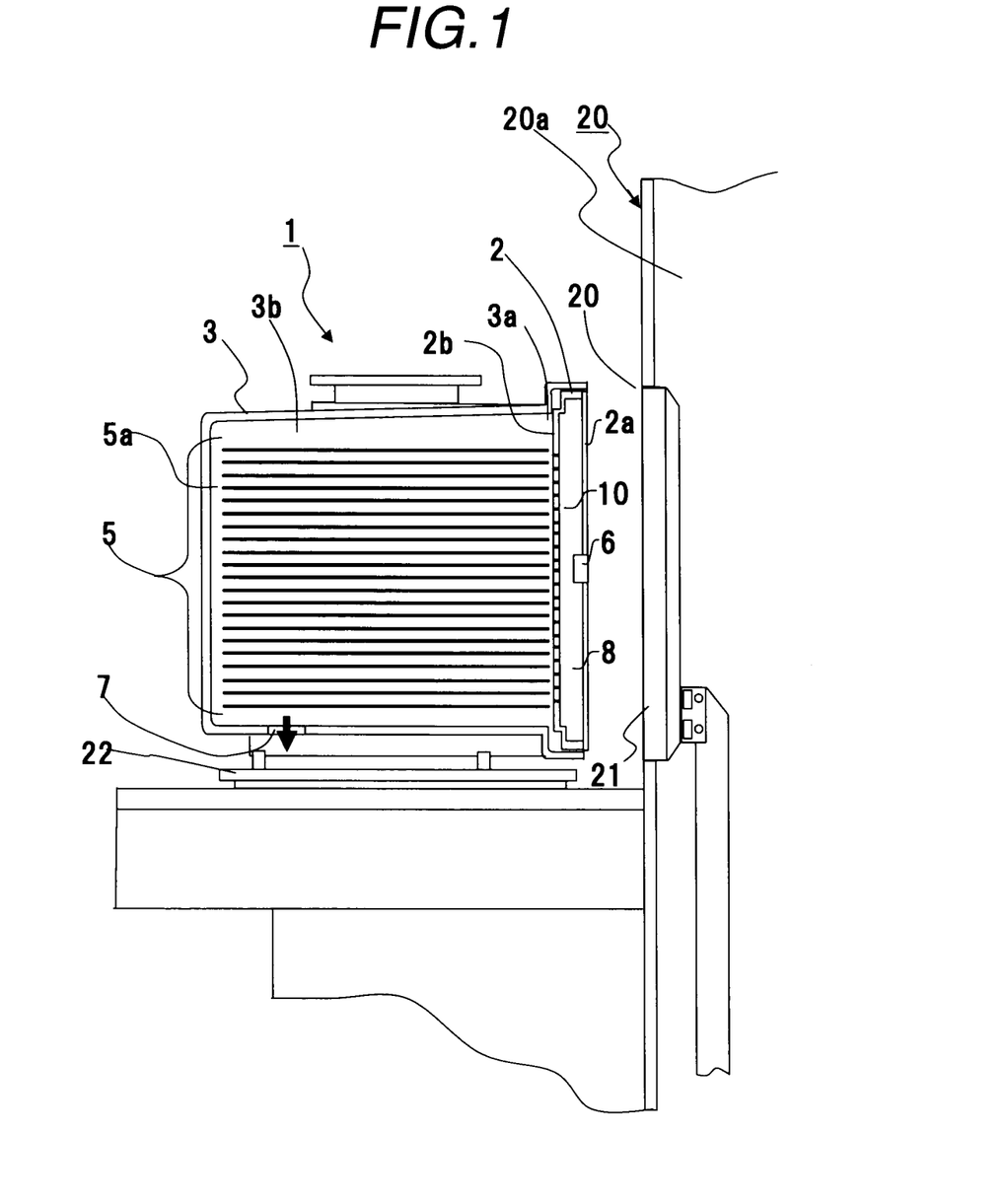
FIG. 1 illustrates a structure of a pod according to the present invention in a state of being placed on a processing apparatus.
Figure 2A:
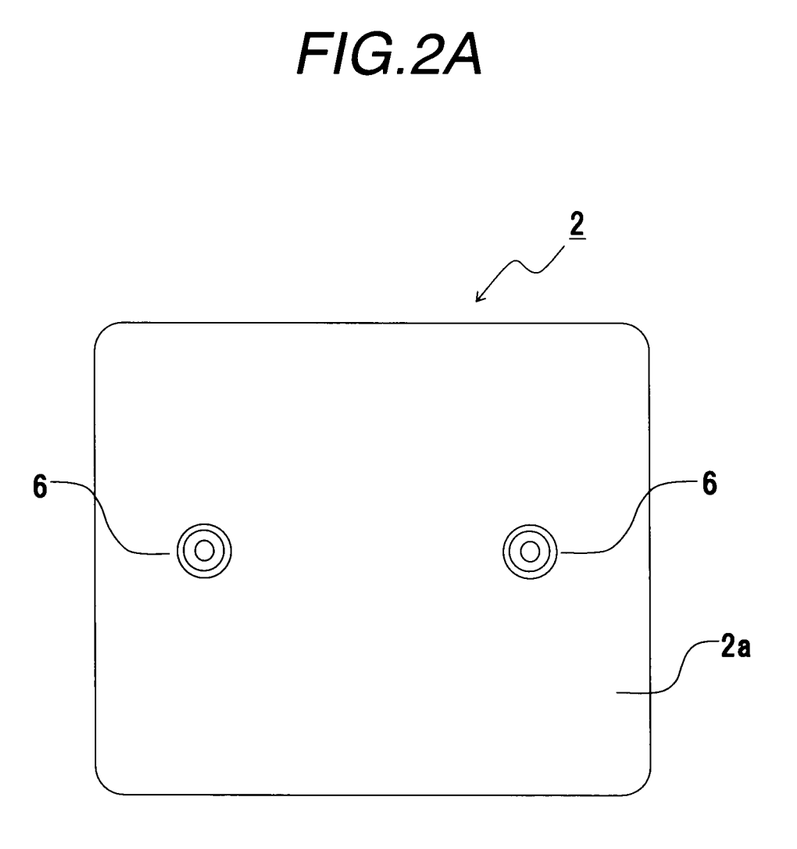
FIG. 2A illustrates an outer surface of a lid member.
Figure 2B:
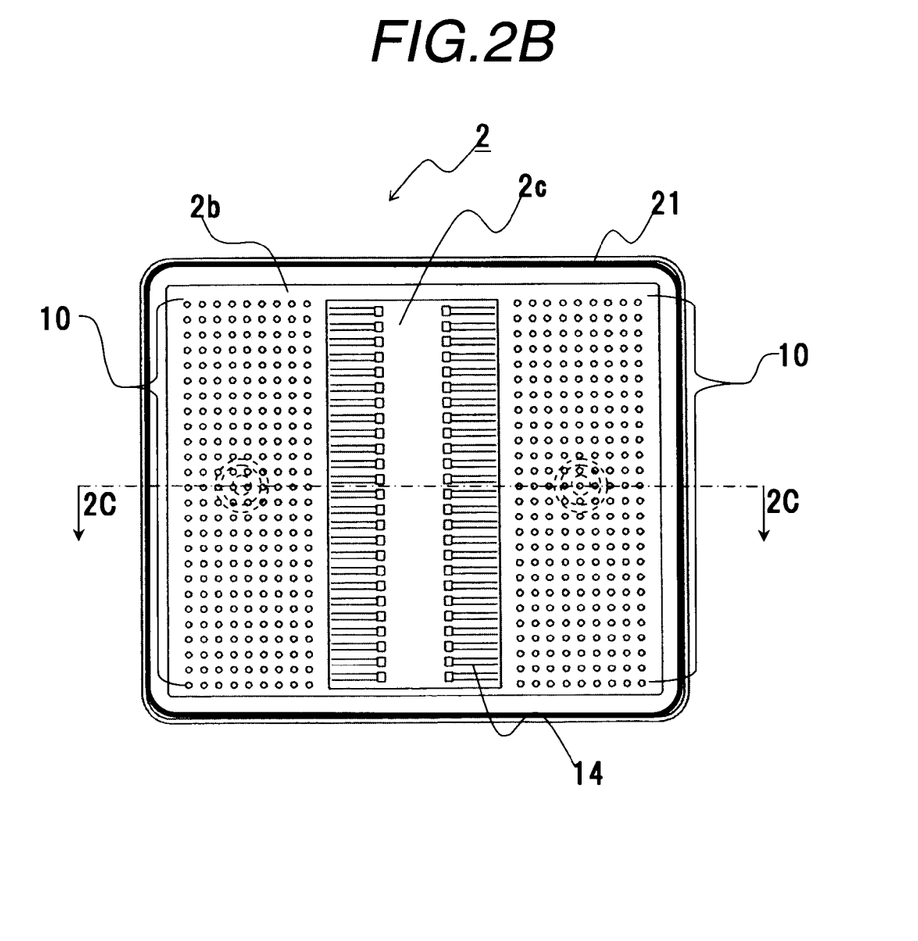
FIG. 2B illustrates an inner surface of the lid member.
Figure 2C:
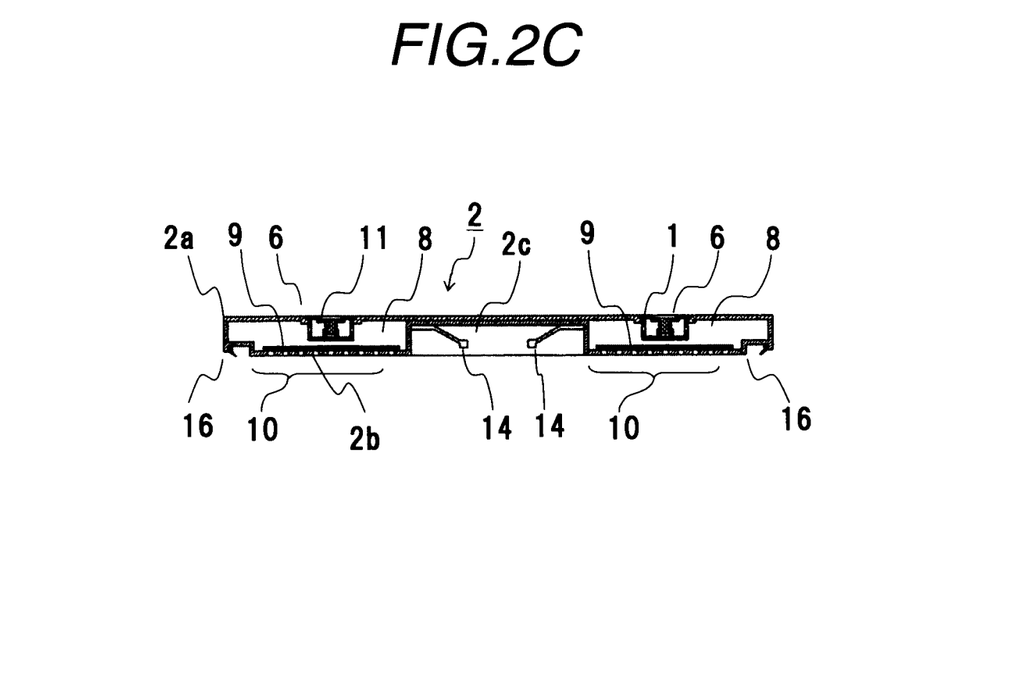
FIG. 2C is a sectional view taken along the line 2C-2C of FIG. 2B.

In the following, description is made of a pod of the present invention with reference to FIGS. 1 and 2A to 2E. FIG. 1 illustrates a pod 1 of the present invention, illustrating a state in which the pod 1 is placed on a processing apparatus 20. FIG. 2A illustrates a front side of an outer surface of a lid member 2 of the pod 1. FIG. 2B illustrates an inner plate 2b of the lid member 2 of the pod 1. FIG. 2C is a sectional view of the lid member 2, taken along the line 2C-2C. Note that, the processing apparatus 20 is similar to the above-mentioned substrate-processing apparatus according to the related art. In the following, first, description is made only of the outline of the processing apparatus 20, and then, description is focused on details, how the pod of the present invention and the processing apparatus 20 are used and different from conventional ones.

The processing apparatus 20 includes an interior space 20a maintaining high cleanliness for the purpose of performing processing on the substrates in the processing apparatus 20. The processing apparatus 20 has a wall portion provided with an access opening 20b, the access opening 20b being normally closed by a door 21 when the processing is not performed. The processing apparatus 20 includes a load port portion 22 for installation of the pod 1 to a predetermined position so that the pod 1 appropriately faces the access opening 20b.

When processing steps are performed on substrates, the pod 1 is placed on the load port portion 22 of the processing apparatus 20. Then, the door 21 closing the access opening 20b of the processing apparatus 20 opens the access opening 20b and the pod 1. Meanwhile, after all the processing steps on the substrates in the pod 1 are completed, the door 21 of the processing apparatus 20 re-closes the access opening 20b and the pod 1 so as to seal the pod 1. Then, atmosphere in the pod 1 is replaced with a replacement gas.

(Pod)

The pod 1 includes the lid member 2 and the opening 3a in one surface, and also includes a pod case 3 provided with a hollow inner space 3b for housing the substrates therein. The lid member 2 has a polygonal shape (typically, quadrangular shape) corresponding to a shape of the opening 3a of the pod case 3, and is a member for closing and sealing the opening 3a under a state in which the lid member 2 is completely fit-inserted to the opening 3a. In the present invention, in the state where the lid member 2 is completely fit-inserted to the opening 3a in a predetermined state, a surface of the lid member 2 on a side of facing an interior space of the pod 1 is defined as an inner surface (inside), while another surface of the lid member 2 on an opposite side to the inner surface is defined as the outer surface (outside).

The lid member 2 includes the inner plate 2b of the lid member 2 positioned on an inner-surface side of the lid member 2, an outer plate 2a positioned on an outer-surface side of the lid member 2, and side plates of the lid member 2. An inside of the lid member 2 is hollow. Buffer spaces 8 are defined in the hollow lid member 2. The buffer spaces 8 may be used as tanks arranged in the lid member 2. However, it is optimal that the buffer spaces 8 be hollow spaces in the lid member 2, that is, as interior spaces defined by the inner plate 2b of the lid member 2, the outer plate 2a of the lid member 2, and the side plates of the lid member 2. In particular, it is preferred that, under a state in which the lid member 2 is fit-inserted to the opening 3a of the pod case 3 as predetermined, the inner plate 2b of the lid member 2 form a part of a wall portion of each of the buffer spaces 8. Plural holes 10 are arranged in the inner plate 2b of the lid member 2. Under the state in which the lid member 2 is fit-inserted to the opening 3a of the pod case 3 as predetermined, the plural holes 10 are provided on the inner plate 2b of the lid member 2 so as to pass through the inner plate 2b to establish communication between the inner plate 2b of the lid member 2 and each of the buffer spaces 8. Through the plural holes 10, the hollow inner space 3b of the pod case 3 and the buffer spaces 8 fluidically communicate with each other. The replacement gas supplied into the buffer spaces 8 is sent out from the buffer spaces 8 to the hollow inner space 3b of the pod case 3 through the plural holes 10. The lid member 2 includes air-supply ports 6 fluidically communicating to the buffer spaces 8. The air-supply ports 6 are arranged, for example, in the outer plate 2a of the lid member 2, and are fluidically connectable to supply piping (not shown) connected to a replacement-gas source. The air-supply ports 6 supply the replacement gas into the buffer spaces 8.

Each of the plural holes 10 sends out the replacement gas supplied into the buffer spaces 8 into the hollow inner space 3b of the pod case 3. It is preferred that a volume of each of the buffer spaces 8 be set to be sufficiently large to prevent a flow rate of the replacement gas flowing from all the plural holes 10 into the hollow inner space 3b of the pod case 3, from fluctuating by variation of an internal pressure in the buffer space. With this, when the replacement gas is introduced into the buffer spaces 8, an influence of pressure variation of the replacement gas can be removed, the pressure variation being caused by a pulse of pressure in air-supply piping. The replacement gas is introduced from the buffer spaces 8 into the hollow inner space 3b through the plural holes 10, and hence stable replacement-gas flow can be obtained.

Specifically, based on equations of state for gases, the following relation expressed by Equation 1 is established: where a mass flow rate of the replacement gas is G(t), pressure in the buffer spaces 8 is P(t), the volumes of the buffer spaces 8 are V, a replacement-gas temperature in the buffer spaces 8 is T, and a gas constant is R.

$$P(t) \cdot V = G(t)RT \qquad \text{[Equation 1]}$$

The temperature T in the buffer spaces 8 and the volumes V of the buffer spaces 8 are constant. Therefore, the following Equation 2 is obtained by total differentiation of both sides of Equation 1 with respect to the time T and arrangement of both the sides thereof.

$$dP(t)/dt = (RT/V) \times (dG(t)/dt) \qquad \text{[Equation 2]}$$

Even when variation occurs in the mass flow rate G (dG(t)/dt) of the replacement gas flowing-in through the air-supply piping, a pump, and the like, an influence by pressure variation of the replacement gas (dP(t)/dt) is suppressed by an increase of the volumes V of the buffer spaces 8. As a result, the replacement gas can be stably supplied from the holes 10 into the pod case 3.

Further, it is preferred that the holes 10 be provided in two directions orthogonal to each other on the inner plate 2b of the lid member 2 under the state in which the lid member 2 is fit-inserted to the opening 3a of the pod case 3. The two directions orthogonal to each other are typically a vertical direction and a horizontal direction in the lid member 2 in the state of being fit-inserted to the opening 3a of the pod case 3.

When each of the holes 10 is configured to have a somewhat large sectional area, flow-path resistance therein is reduced. In proportion to reduction of the flow-path resistance, the flow rate of the replacement gas flowing out from the buffer spaces 8 through the holes 10 increases. As a result, depending on presence or absence of the holes 10, a speed profile of the replacement gas flowing out from an inner-plate-2b side of the lid member 2 is non-uniform. As a countermeasure, it is preferred that a filter 9 e.g. a mesh filter, be attached in a manner of covering the plural holes 10 so as to rectify the replacement gas. The filter 9 is arranged, for example, on the inner plate 2b with holes 10 on an interior side of each of the buffer spaces 8 of the lid member 2. Arrangement of the filter 9 leads to normalization of a squirting rate of the gas from the plural holes 10, with the result that uniform replacement-gas flow can be obtained. Note that, the filter 9 may be arranged on the inner plate 2b with holes 10 on an outside of the buffer spaces 8 of the lid member 2.

Figure 2D:
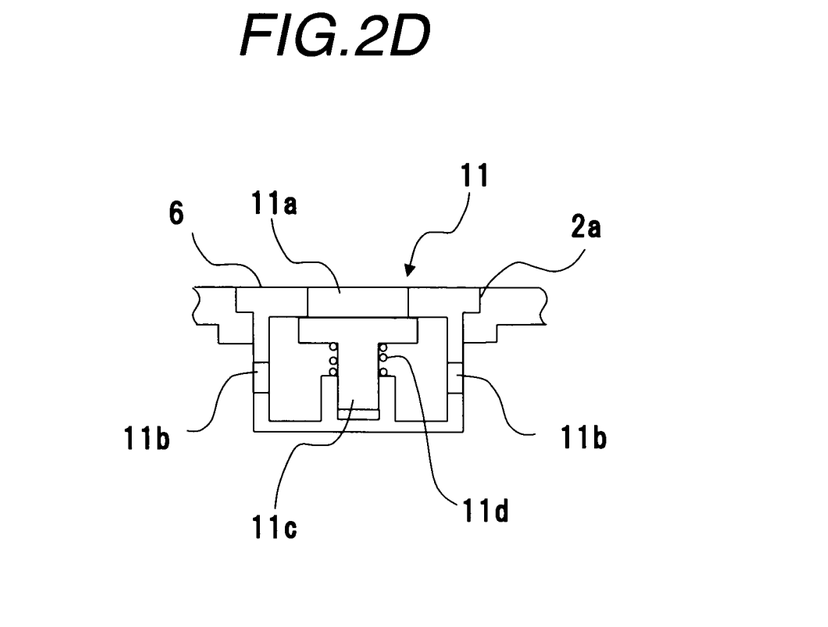
FIG. 2D illustrates an air-supply valve member in a close state.
Figure 2E:
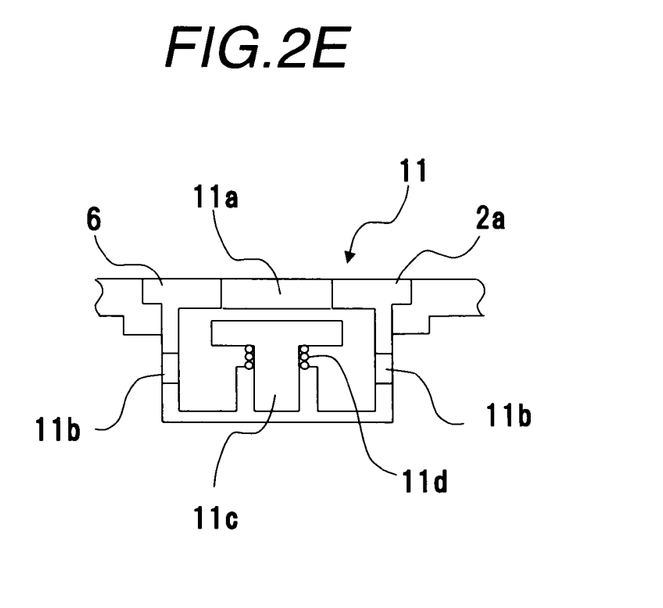
FIG. 2E illustrates the air-supply valve member in an open state.

An air-supply valve member 11 is fitted into each of the air-supply ports 6. FIGS. 2D and 2E illustrate the air-supply valve member 11. FIG. 2D illustrates the air-supply valve member in a close state, and FIG. 2E illustrates the air-supply valve member in an open state.

The air-supply valve member 11 includes an introduction opening 11a and air-supply openings 11b. The introduction opening 11a is an inlet-opening portion of the air-supply valve member 11 arranged in the outer plate 2a of the lid member 2, and introduces the replacement gas from the air-supply piping. The air-supply openings 11b are outlet-opening portions of the air-supply valve member 11 arranged on the interior side of each of the buffer spaces 8. The air-supply openings 11b are arranged at angles with respect to directions toward the holes 10 arranged on the inner plate 2b of the lid member 2. By positioning in this manner, the replacement gas introduced from the introduction opening 11a does not flow directly into the holes 10 through the air-supply openings 11b, and can be introduced through the air-supply openings 11b into the buffer spaces 8 in a direction different from those of the holes 10. It is optimal that, for example, as in this embodiment, the air-supply openings 11b be arranged at right angles with respect to the introduction opening 11a so that the air-supply openings 11b are arranged at right angles also with respect to the holes 10. A piston portion 11c is arranged in the valve member 11, and the air-supply valve member 11 closes the introduction opening 11a in a normal state. In this state, a spring 11d urges the piston portion 11c, and then a head of the piston portion 11c closes and seals the introduction opening 11a. When the air-supply piping is connected to the air-supply ports 6 and the replacement gas is introduced from the introduction opening 11a, pressure of the replacement gas causes the spring 11d to be compressed, and then the head of the piston portion 11c retracts so that the air-supply valve member 11 opens. From a gap of the introduction opening 11a closed by the head of the piston portion 11c, the replacement gas flows into the air-supply valve member 11, and then introduced into the buffer spaces 8 through the air-supply openings 11b.

With this, uniform gas flow is obtained without generation of strong flow of the replacement gas only near all the holes 10.

A recessed portion 2c is formed in the inner plate 2b side of the lid member 2, and wafer retainers 14 are arranged in the recessed portion 2c. A gasket 16 is arranged on a peripheral portion on the inner plate 2b side of the lid member 2. The gasket 16 is attached in a manner of projecting inward in cross-section. This arrangement causes the gasket 16 to press a wall portion of the pod case 3 from an inside of the pod case 3 when the lid member 2 is fit-inserted to the opening 3a so as to seal the opening 3a. When pressure in the pod case 3 becomes higher than ambient atmosphere, the high inner pressure causes the gasket 16 to be firmly pressed against the wall portion of the pod case 3. As a result, excellent sealability is obtained, which leads to enhancement of air-tightness of the pod 1 as a whole.

Even when the recessed portion 2c having the wafer retainers 14 arranged therein effectively divides the interior space in the lid member 2, advantages of the present invention are obtained as long as the divided spaces constitute the buffer spaces 8. Specifically, as illustrated in FIG. 2B, it suffices that the plural holes 10 are arranged in each part of the inner plate 2b of the lid member 2 so that the volumes of the buffer spaces 8 are set to be sufficiently large, the inner plate 2b being divided by the recessed portion 2c.

Typically, the pod case 3 is substantially a hexahedron, and the opening 3a is arranged in one surface thereof. The pod case 3 has the hollow inner space 3b therein. A shelf 5 is arranged in the hollow inner space 3b, and is capable of housing substrates. The shelf 5 is, for example, adjacent to the opening 3a of the pod case 3, and is arranged between two vertical side surfaces facing each other. The shelf 5 includes multiple stages 5a arranged in parallel with each other in the vertical direction in a normal state of the pod 1. The multiple stages 5a are horizontally arranged in pairs so as to correspond respectively to the side surfaces of the pod case 3, and each pair of the stages 5a is capable of holding both ends of corresponding one of the substrates. When the lid member 2 closes the opening 3a of the pod case 3, the recessed portion 2c is formed in the inner-plate-2b side of the lid member 2, and the wafer retainers 14 are arranged in the recessed portion 2c.

The substrate placed on each pair of the stages 5a can be taken out or inserted through the opening 3a by being moved in the horizontal direction when the lid member 2 of the pod 1 is opened.

In the pod case 3, an exhaust port 7 is arranged in a lower portion on an inner-end side of the pod case 3 (load-port-portion-22 side), the inner-end side corresponding to an opposite side of the opening 3a.

Under the state in which the lid member 2 is fit-inserted to the opening 3a of the pod case 3, the plural holes 10 are arranged between the stages 5a of the shelf 5. That is, it is preferred that the plural holes 10 have positional relations determined correspondingly to spaces between the stages 5a of the shelf 5, and be provided on the inner plate 2b of the lid member 2. By positioning them in this manner, the replacement gas introduced from the plural holes 10 into the hollow inner space 3b of the pod case 3 flows from the opening 3a of the pod case 3 to the exhaust port 7 positioned on the inner-end side of the pod case 3 along the substrates respectively held on the pairs of the stages 5a. Thus, the replacement gas introduced from the air-supply ports 6 into the pod 1 forms a simple replacement-gas flow path before reaching the exhaust port 7. As a result, flow free from stagnation portions can be achieved.

(Processing Apparatus)

Next, in the following, with reference to FIG. 1, description is made of how the processing apparatus 20 in which the pod 1 of the present invention is used is different from conventional processing apparatuses.

The processing apparatus 20 includes the air-supply piping fluidically connected to the replacement-gas source filled with the replacement gas. The air-supply piping is arranged so as to be fluidically connectable to the air-supply ports 6 so that the replacement gas is supplied into the buffer spaces 8 of the lid member 2 of the pod 1 through the air-supply ports 6. Meanwhile, the processing apparatus 20 includes exhaust piping (not shown) which is provided on a load port side corresponding to the lower portion of the pod 1 and which is connected to an exhaust pump (not shown). The exhaust piping is fluidically connectable to the exhaust port 7 of the pod 1, and is capable of exhausting the replacement gas from the hollow inner space 3b of the pod 1 through the exhaust port 7. The exhaust piping is configured to be somewhat larger in diameter so as to suppress flow-path resistance in the pipeline of the replacement gas. Lowering of back pressure on an exhaust-port-7 side of the pod 1 causes the replacement gas to flow in the pod 1 from the inner-surface side of the lid member 2 to the inner-end side of the pod case 3 of the pod 1 along wafers respectively placed on the pairs of the stages of the shelf 5. The replacement gas having reached the inner-end side of the pod case 3 of the pod 1 descends in the pod 1 and generates, in the pod 1, flow to be exhausted from the exhaust port 7. With this, an advantage is obtained that a gas of high cleanliness reaches throughout the pod 1 without stagnation.

Figure 3A:
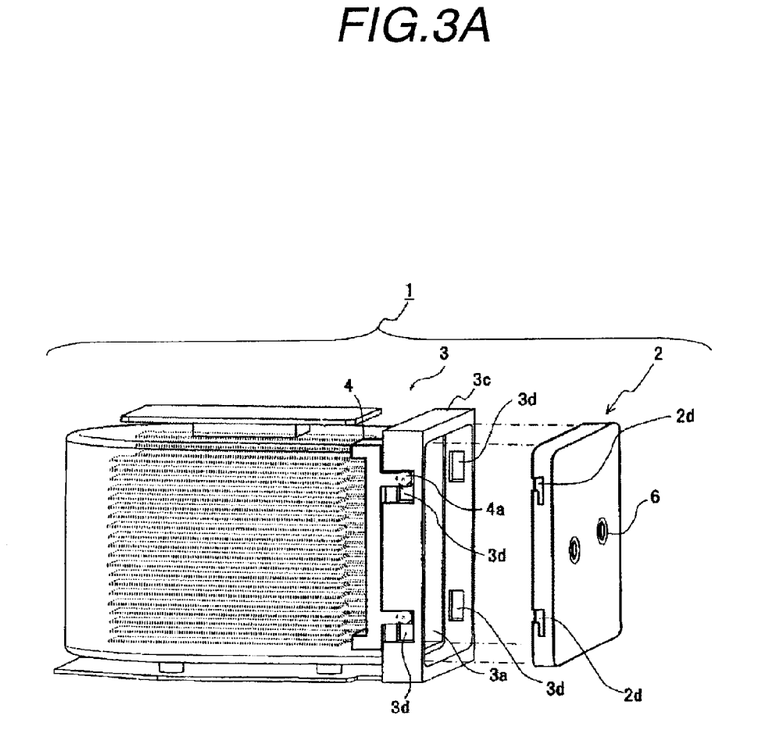
FIG. 3A illustrates a pod including a slide-latch mechanism.

Note that, the pod 1 according to the invention of the present application is especially suitable to a pod using a slide-latch mechanism in which a locking mechanism is not arranged in the lid member. Examples of the pod using a slide-latch mechanism in which a locking mechanism is not arranged in the lid member include one illustrated in FIG. 3A. Specifically, the pod 1 as illustrated in FIG. 3A includes a flange 3c having a predetermined thickness and arranged around the opening 3a of the pod case 3 of the pod 1. In side surfaces of the lid member 2, multiple latch-engaging recessed portions 2d are provided. Each of the multiple latch-engaging recessed portions 2d is provided with an elongated groove along a periphery of the side surfaces of the lid member 2 and another groove extending from the elongated groove to the inner-surface side of the lid member 2. Each of the multiple latch-engaging recessed portions 2d is formed as an engaging recessed portion exhibiting an L-shape when viewed from a side-surface side. Multiple penetrating elongated holes 3d (not shown) are arranged in the flange 3c around the opening 3a of the pod case 3 of the pod 1. Under a state in which the lid member 2 is fitted into to the opening 3a of the pod case 3 as predetermined, positions of the latch-engaging recessed portions 2d respectively corresponds to the penetrating elongated holes 3d. The pod case 3 of the pod 1 is provided with a bar-like latch mechanism 4 (not shown) arranged so as to slide along the flange 3c around the opening 3a. In the latch mechanism 4, there are arranged coupling arms 4a (not shown) each including a roller portion provided at a distal end thereof and projecting perpendicular to an extending direction of the latch mechanism 4. The roller portion at the distal end portion of the coupling arm 4a is exposed to the inside of the pod case 3 through the penetrating elongated hole 3d. When the lid member 2 is fitted into the opening 3a of the pod case 3 of the pod 1, the roller portion of the coupling arm 4a is engaged with each of the latch-engaging recessed portions 2d in the side surfaces of the lid member 2. The coupling arm 4a slides in accordance with sliding of the latch mechanism 4 along with a rim of the flange 3c in the vertical direction. In accordance therewith, the roller portion at the distal end of the coupling arm 4a moves along the penetrating elongated hole 3d. Then, the roller portion at the distal end of the coupling arm 4a moves to reach a distal end of the elongated groove of each of the latch-engaging recessed portions 2d, with the result that the lid member 2 is fixed to the pod case 3. As has been described above, in the pod 1 employing the slide-latch mechanism, the locking mechanism is not provided in the lid member 2. Thus, no component hinders arrangement of the buffer spaces 8. Further, on the surface of the lid member 2, no component hinders arrangement of the air-supply ports 6 communicating to the buffer spaces 8. Thus, without limitation on position or size, the buffer spaces 8 can be freely arranged in the lid member 2. Therefore, the pod 1 of the present invention is especially advantageous in the pod of this type.

Figure 3B:
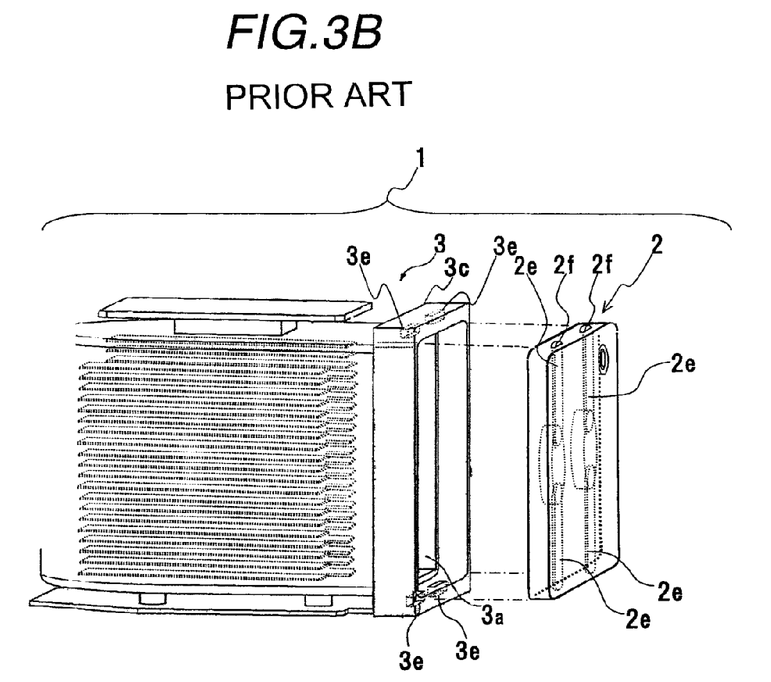
FIG. 3B illustrates a pod including a conventional latch mechanism.

However, as long as the buffer spaces 8 can be arranged, the present invention is applicable to the pod of the conventional type in which the locking mechanism is provided in the lid member. The pod of the conventional type in which the locking mechanism is provided in the lid member includes a pod 1 of a type illustrated in FIG. 3B, for example. Specifically, the pod 1 as illustrated in FIG. 3B includes rotary plates and locking arms 2e which are arranged as a locking mechanism in the lid member 2. One end of each of the locking arm 2e is attached to the rotary plate, and in accordance with rotation of the rotary plate, another end 2f of each of the locking arms 2e projects from the side surface of the lid member 2 and is housed therein. Under the state in which the lid member 2 is fitted into to the opening 3a of the pod case 3 as predetermined, when being made to project from the side surface of the lid member 2, the another end 2f of the locking arm 2e is fit-inserted to an engagement hole 3e on the inside of the pod case 3. As a result, the lid member 2 is fixed. Meanwhile, when the another end 2f of the locking arm 2e having inserted in the engagement hole 3e on the inside of the pod case 3 is housed into the lid member 2, fixation of the lid member 2 and the pod case 3 is released. In the pod 1 of this type, although a volume for the locking mechanism has to be secured in the lid member 2, the present invention is applicable as long as a volume can be secured in which the appropriate buffer spaces 8 are arranged.

The present invention is applicable to a pod for housing substrates such as semiconductor wafers, specifically, a pod in which especially high cleanliness is required.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-041768, filed Feb. 26, 2010, which is hereby incorporated by reference herein in its entirety.

What is claimed is:

1. A substrate storage pod, comprising:
   a pod case which comprises an opening and a hollow inner space for housing one or more substrates in a state where surfaces of the one or more substrates are positioned in a direction perpendicular to the opening;
   a lid member which is fit-inserted to the opening so as to be capable of sealing the opening, the lid member having inner and outer plates, the inner plate facing to an atmosphere in the hollow inner space in the pod case and the outer plate facing to an exterior atmosphere when the lid member is fit-inserted to the opening;
   a buffer space having a certain volume defined between the inner and outer plates in the lid member between the inner and outer plates;
   an air-supply port provided on the outer plate of said lid member, for supplying a replacement gas into the buffer space; and
   a plurality of holes provided on a whole area of the inner plate of said lid member so as to establish fluidically communication between said buffer space and the hollow inner space in a state where said lid member is fit-inserted into the opening of said pod case, for flowing the replacement gas supplied in the buffer space, into the hollow inner space from the buffer space along the surfaces of the one or more substrates,
wherein the certain volume of the buffer space is sufficiently large to reduce fluctuation of an internal pressure of the buffer space, and
wherein the air-supply port includes an air-supply valve member capable of introducing the replacement gas into the buffer space at an angle with respect to directions toward the plurality of holes.

2. A substrate storage pod according to claim 1, wherein the inner plate of the lid member forms a part of a wall portion of the buffer space.

3. A substrate storage pod according to claim 1, wherein the plurality of holes are provided in two directions orthogonal to each other through the inner plate of the lid member in the state of being fit-inserted to the opening of the pod case.

4. A substrate storage pod according to claim 3, wherein the two directions orthogonal to each other are respectively a vertical direction and a horizontal direction in the lid member in the state of being fit-inserted to the opening of the pod case.

5. A substrate storage pod according to claim 1, wherein the hollow inner space of the pod case comprises a shelf provided with multiple stages, each of which is capable of holding a substrate, and
wherein the plurality of holes are partially or entirely positioned at portions corresponding to spaces between each of the multiple stages.

6. A substrate storage pod according to claim 1, wherein the inner plate of the lid member comprises a filter arranged so as to cover the plurality of holes.

7. A lid member for a substrate storage pod comprising a pod case which comprises an opening and a hollow inner space for housing one or more substrates in a state where surfaces of the one or more substrates are positioned in a direction perpendicular to the opening, the lid member being fit-inserted to the opening so as to be capable of sealing the opening, wherein the lid member comprises:
    inner and outer plates, the inner plate facing to an atmosphere in the hollow inner space in the pod case and the outer plate facing to an exterior atmosphere when the lid member is fit-inserted to the opening;
    a buffer space having a certain volume defined between the inner and outer plates in the lid member;
    an air-supply port provided on the outer plate of said lid member, for supplying a replacement gas into the buffer space; and
    a plurality of holes provided on a whole area of the inner plate of said lid member so as to establish communication between the buffer space and the hollow inner space in a state of being fit-inserted to the opening of the pod case, for flowing the replacement gas supplied into the buffer space, into the hollow inner space from the buffer space along the surfaces of the one or more substrates,
    wherein the certain volume of the buffer space is sufficiently large to reduce fluctuation of an internal pressure of the buffer space, and
    wherein the air-supply port includes an air-supply valve member capable of introducing the replacement gas into the buffer space at an angle with respect to directions toward the plurality of holes.

8. A lid member for a substrate storage pod according to claim 7, wherein the buffer space comprises a wall portion forming a part of a wall of the inner plate of the lid member in the state of being fit-inserted to the opening of the pod case.

9. A lid member for a substrate storage pod according to claim 7, wherein the plurality of holes are provided in two directions orthogonal to each other through the inner plate of the lid member in the state of being fit-inserted to the opening of the pod case.

10. A lid member for a substrate storage pod according to claim 9, wherein the two directions orthogonal to each other are respectively a vertical direction and a horizontal direction in the lid member in the state of being fit-inserted to the opening of the pod case.

11. A lid member for a substrate storage pod according to claim 7,
wherein the hollow inner space of the pod case comprises a shelf provided with multiple stages, each of which is capable of holding a substrate, and
wherein the plurality of holes are partially or entirely positioned at portions corresponding to spaces between each of the multiple stages when the lid member closes the opening of the substrate storage pod.

12. A lid member for a substrate storage pod according to claim 7, wherein the inner plate of the lid member comprises a filter arranged so as to cover the plurality of holes.

* * * * *